(12) United States Patent
Levin et al.

(10) Patent No.: US 7,485,941 B2
(45) Date of Patent: Feb. 3, 2009

(54) COBALT SILICIDE SCHOTTKY DIODE ON ISOLATED WELL

(75) Inventors: Sharon Levin, Haifa (IL); Shye Shapira, Haifa (IL); Ira Naot, Zikhron Yaakov (IL); Robert J. Strain, San Jose, CA (US); Yossi Netzer, Hadera (IL)

(73) Assignee: Tower Semiconductor Ltd., Migdal Haemek (IL)

( * ) Notice: Subject to any disclaimer, the term of this patent is extended or adjusted under 35 U.S.C. 154(b) by 480 days.

(21) Appl. No.: 11/255,338

(22) Filed: Oct. 21, 2005

(65) Prior Publication Data
US 2006/0125040 A1 Jun. 15, 2006

Related U.S. Application Data

(60) Provisional application No. 60/636,693, filed on Dec. 15, 2004.

(51) Int. Cl.
*H01L 29/47* (2006.01)
(52) U.S. Cl. .............................. 257/476; 257/E29.338; 438/570
(58) Field of Classification Search .................. 257/471, 257/476, 485, 486, E29.327, E29.338; 438/510, 438/514, 533, 534, 570, 571, 580, 581, 582, 438/583
See application file for complete search history.

(56) References Cited

U.S. PATENT DOCUMENTS

| 5,347,161 | A | 9/1994 | Wu et al. |
| 6,825,073 | B1 | 11/2004 | Wu |
| 2003/0181011 | A1* | 9/2003 | Curro et al. ................. 438/270 |
| 2004/0012066 | A1* | 1/2004 | Dietl et al. ................... 257/471 |

* cited by examiner

*Primary Examiner*—Evan Pert
*Assistant Examiner*—Kevin Quinto
(74) *Attorney, Agent, or Firm*—Bever, Hoffman & Harms, LLP; Patrick T. Bever

(57) ABSTRACT

A Schottky diode is formed on an isolated well (e.g., a P-well formed in a buried N-well), and utilizes cobalt silicide ($CoSi_2$) structures respectively formed on heavily doped and lightly doped regions of the isolated well to provide the Schottky barrier and backside (ohmic) contact structures of the Schottky diode. The surrounding buried N-well is coupled to a bias voltage. The Schottky barrier and backside contact structures are separated by isolation structures formed using polycrystalline silicon, which is used to form the gate structure of CMOS FETs, in order to minimize forward resistance. Heavily doped drain (HDD) diffusions and lightly doped drain (LDD) diffusions, which are used to form source and drain diffusions of the FET, are utilized to form a suitable contact diffusion under the backside contact silicide.

17 Claims, 5 Drawing Sheets

COBALT SILICIDE SCHOTTKY DIODE ON ISOLATED WELL

RELATED APPLICATIONS

This application claims priority of U.S. Provisional Patent Application 60/636,693, entitled "Cobalt Silicide On Lightly Doped Silicon Diode Embedded In Standard CMOS Flow For High Frequency And Mixed Signal Applications" filed Dec. 15, 2004.

FIELD OF THE INVENTION

This invention relates to integrated circuits (ICs), more particularly, to complementary metal oxide semiconductor (CMOS) ICs that incorporate Schottky diodes.

BACKGROUND OF THE INVENTION

Schottky diodes are important passive components in, for example CMOS ICs that perform radio frequency (RF) and mixed signal (MS) functions. CMOS Schottky diodes include two terminals, an anode and a cathode, that are formed on a surface of the CMOS integrated circuit substrate (e.g., monocrystalline silicon), and also include isolation structure positioned between the anode and cathode. The Schottky diode consists a Schottky barrier, which is a metallic region, in direct contact with a relatively lightly doped semiconducting region, a method providing an ohmic contact to that lightly doped semiconducting region, which will be called a backside contact, and the structures necessary to define and isolate the two different contact regions. According to the choice of substrate doping and the metallic material, the metallic region may be either a cathode or an anode. When the metallic material is in contact with a P-type region, it takes the role of cathode. On the other hand, if the metallic material is in contact with N-type silicon, it takes the role of an anode. In either case, the Schottky diode is completed with an ohmic contact to the underlying semiconductor region. When the Schottky diode is biased so that the anode is positive with respect to the cathode, and when a sufficient bias voltage exists between the Schottky barrier and the Ohmic contact, a relatively high current is produced that passes through the intervening substrate. When the anode is biased negatively with respect to the cathode, a much reduced, reverse current flows. Like all diodes, the Schottky diode is subject to breakdown if excessive reverse voltage is applied. The magnitudes of the forward and reverse currents are determined first by the choice of N-type or P-type semiconducting material, second by the choice of metallic material, third by the doping density of the semiconducting material, and finally by the details of the device geometry.

Due to the general trend toward RF and MS CMOS ICs that function at ever-lower operating voltages, there is a need for passive components, such as Schottky diodes, that exhibit a sufficiently low turn on voltage and low series resistance. In addition, there is a need for passive components, such as Schottky diodes, that are fabricated to minimize parasitic resistance and capacitance, which would impair the operation of the circuits they support. These Schottky diode operating characteristics can be "tuned" to a desired level through the selection of either N-type or P-type doping for the semiconducting region, the selection of metallic material used to form the Schottky barrier and ohmic contact, the doping levels of the diode well, and the distance between the anode and cathode (i.e., the width of the isolation structure).

Schottky diodes were originally used in bipolar ICs, where metal junctions were formed on regions of the underlying silicon substrate doped with an N-type dopant. The turn-on voltage of these Schottky diodes was determined by characteristics of the selected metal, and by the doping density of the underlying silicon regions. Schottky diodes are utilized in RF and MS ICs, for example, to produce voltage multipliers, RF mixers, and efficient high speed rectifiers. However, the operation of Schottky diodes that are made using conventional methods suffers from parasitic capacitance and leakage to the underlying substrate. Such a leakage path can bypass the diode, degrading the diode's rectifying or nonlinear behavior. Further, when product or design consideration dictate that the Schottky barrier be formed with respect to a region, P-type or N-type, which has the same doping character as the substrate, one terminal of the Schottky diode will be directly shorted to the substrate, unless measures are taken to isolate that device.

What is needed is a method for fabricating Schottky diodes for low voltage RF and MS circuits whereby the parasitic capacitance and conduction to the underlying substrate is substantially minimized. What is needed is a Schottky diodes in which series resistance is minimized in order to facilitate low voltage operation. What is also needed is a method for producing such Schottky diodes that can be incorporated into a standard CMOS processing flow and in a manner that reduces the number of additional processing steps, thus maintaining the lowest production cost possible for such a diode and the circuits incorporating the diode.

SUMMARY OF THE INVENTION

The present invention is directed to a Schottky diode formed on an isolated well (preferably a P-well formed in a buried N-well), and utilizes cobalt silicide ($CoSi_2$) structures respectively formed on lightly doped and heavily doped regions of the isolated well to provide the Schottky barrier and backside (ohmic) contact structures of the Schottky diode. The present inventors have found that the formation of $CoSi_2$ structures on isolated P-wells provides Schottky diodes exhibiting a lower threshold barrier, thus providing a lower turn-on voltage (Von) and higher forward currents despite the lower value of the effective Richardson constant (A**) relative to a comparable diode formed on N-type material, thus facilitating the production of highly effective RF devices.

According to another aspect of the invention, the buried N-well surrounding the isolated P-well includes a deep N-well portion that extends under the isolated P-well, and side N-well portions that extend along side edges of isolated P-well from deep N-well portion to the upper substrate surface, and is connected to a suitable bias source such that the buried N-well forms a isolating ring around the isolated P-well. By isolating the P-well from the substrate in this manner, the present invention provides Schottky diodes exhibiting improved DC and noise isolation, thus facilitating superior RF operations.

Further, the use of lightly-doped N-well as a isolating ring in this manner reduces capacitance and increases the breakdown voltage of the Schottky diode, and facilitates the production of relatively small devices.

According to an aspect of the present invention, the Schottky barrier and backside ohmic contact of the Schottky diode are separated from each by an isolation structure such that a current flowing between the first and second silicide structures passes through the implant and at least a portion of the isolated well. In one exemplary embodiment the isolation structure includes polycrystalline silicon, and in another exemplary embodiment the isolation structure includes an STI structure. Both of these isolation structures are conveniently formed using a standard CMOS fabrication process, thus facilitating the production of high quality Schottky diodes without adding significant processing steps.

In a specific embodiment of the present invention, a gate-defined Schottky diode utilizes a "gate-like" polycrystalline silicon isolation structure formed on the substrate surface, in place of the conventional STI-type isolation structure, thereby facilitating a reduction in the current path between the anode and cathode, thus reducing the Schottky diode's series resistance. The present invention is also directed to CMOS ICs including gate-defined Schottky diodes in isolated P-wells wherein the "gate-like" polycrystalline silicon isolation structure is formed simultaneously with the gate structure of CMOS FETs, thereby facilitating production of the Schottky diode with minimal interruption to a standard CMOS processing flow, thus maintaining the lowest possible production cost.

According to yet another aspect of the invention, $CoSi_2$ structures are formed on upper surfaces of the polysilicon isolation structures separating the anode and cathode of gate-defined Schottky diodes in isolated P-wells, thus allowing the polysilicon structure to be used as a third terminal of the Schottky diode.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

As used herein, the terms "doped region", "implant", and "well" refer to contiguous regions of a semiconductor substrate that are characterized by a predominance of a selected dopant type (i.e., P-type or N-type) that produces a desired conductance in a manner well known in the art. For convenience, regions exhibiting this predominance of P-type or N-type carriers are referred to herein as having a P-type or N-type doping concentration, or having a P- or N-conductivity type. The terms "P+" and "N+" are used herein to denote such regions/implants/wells of relatively high doping concentrations, and the terms "P–" and "N–" are used herein to denote such regions/implants/wells of relatively low doping concentrations. In addition, directional terms such as "upper", "under" and "over" are intended to provide relative positions for purposes of description, and are not intended to designate an absolute frame of reference.

Figure 1:
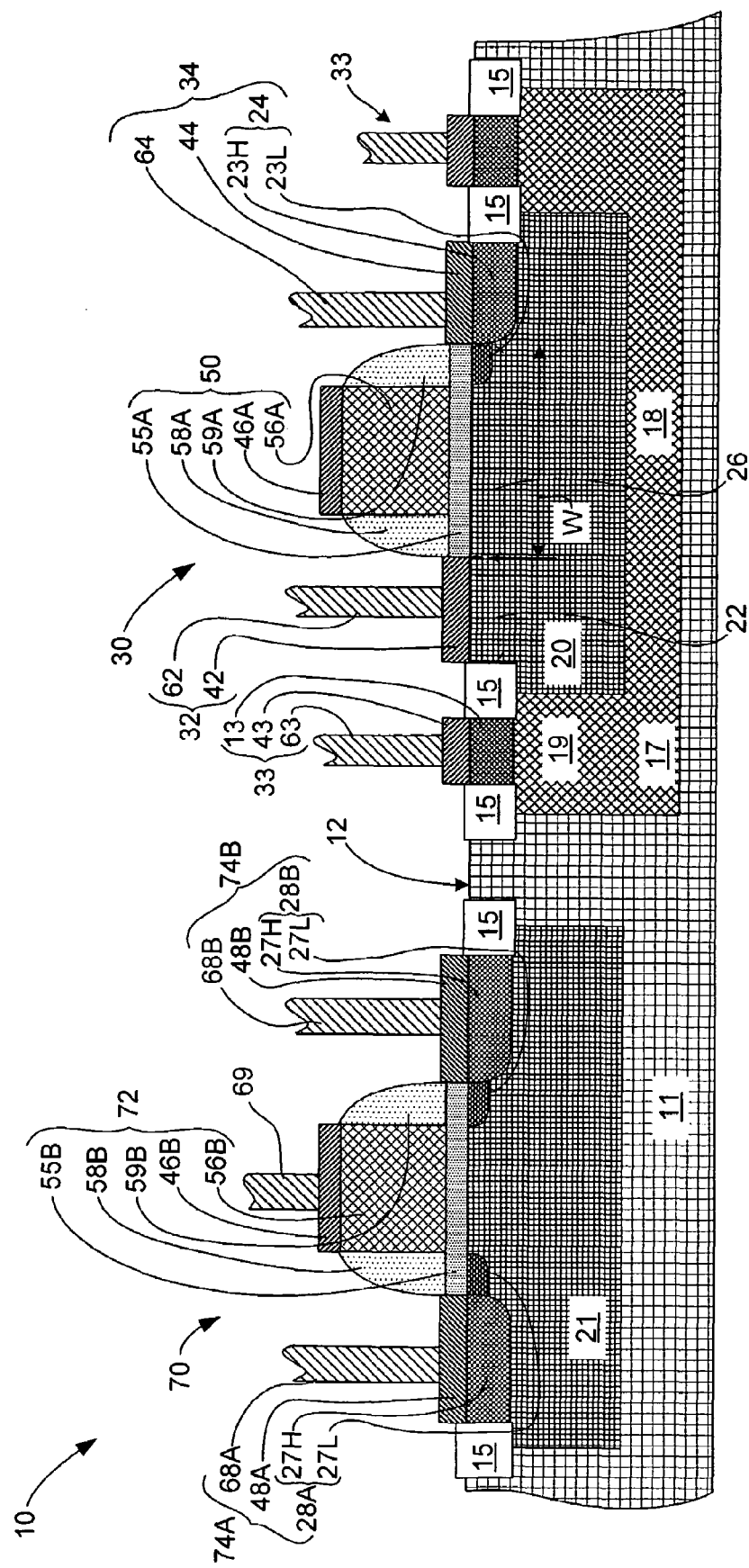
FIG. 1 is a cross-sectional side view showing a CMOS IC device including a gate-defined Schottky diode in an isolated P-well and a CMOS FET according to an embodiment of the present invention.

FIG. 1 is a cross-sectional side view showing a simplified complimentary complementary metal-oxide-semiconductor integrated circuit (CMOS IC) device 10 including a Schottky diode 30 and a CMOS field effect transistor (FET) 70 formed on a substrate 11 in accordance with an exemplary embodiment of the present invention. Schottky diode 30 and a CMOS FET 70 are illustrated in simplified form in FIG. 1 in order to emphasize the common structures and shared features associated with these component types. The position of Schottky diode 30 relative to a CMOS FET 70, and the shapes and locations of the structures associated with these components, are selected for explanatory purposes.

In one embodiment, substrate 11 is a monocrystalline silicon wafer "chip" having an upper surface 12. Substrate 11 is lightly doped with a first dopant type (i.e., P-type or N-type) such that substrate 11 has a first conductivity. Formed in substrate 11 are a buried well 17, an isolated well 20, and a secondary well 21 that is spaced from buried well 17 and isolated well 20. Buried well 17 has a conductivity opposite to substrate 11, and isolated well 20 has a conductivity that is the same type as substrate 11 (i.e., opposite to buried well 17). Secondary well 21 can be either conductivity type (i.e., either P-type or N-type, depending on the type of FET to be produced and the conductivity type of substrate 11). Buried well 17, isolated well 20, and secondary well 21 are formed in accordance with known CMOS techniques.

According to a preferred embodiment of the present invention, isolated well 20 has a P-type conductivity, and buried well 17, which entirely surrounds isolated P-well 20, has an N-type conductivity. That is, buried N-well 17 includes both a deep N-well portion 18 that extends under isolated P-well 20, and side N-well portions 19 that extend along side edges of isolated P-well from deep N-well portion 18 to upper surface 12. Normally, the side well portions 19 are formed in the same processing steps which are employed to form a conventional well for one type of transistor. In this case, the sidewalls 19 would be formed from the same lithographic and implant steps used to create the N-well for a PMOS transistor. At the expense of an added mask and implant, the sidewall portion 19 of the deep N-well 17 may be customized to further optimize the capacitance or isolation characteristics.

Schottky diode 30 is formed entirely on the portion of upper surface 12 that is located over isolated well 20, and is generally made up of a metallic structure 32, a backside contact structure 34, and an isolation structure 50 that is generally positioned between metallic structure 32 and contact structure 34. Metallic structure 32 includes a (first) silicide (Schottky barrier) structure 42 that is formed on upper surface 12 over a portion (first doped region) 22 of well region 20. Backside contact structure 34 includes a second silicide (Ohmic contact) structure 44 formed on upper surface 12 over a relatively highly doped contact region (second doped region) 24 of well region 20, where the dopant used to form contact region 24 is the same (i.e., either N-type or P-type) as the dopant used to form isolated well 20. Isolation structure 50 is located between first silicide structure 42 and second silicide structure 44. In the present embodiment, isolation structure 50 is located on upper surface 12 over another portion (third doped region) 26 of well region 20. Metallic structure 32 and backside contact structure 34 further include metal contact structures 62 and 64, respectively, that are formed on upper surfaces of silicide structures 42 and 44 according to known techniques. Peripheral isolation structures 15 (e.g., silicon trench isolation (STI) or local oxidation of silicon (LOCOS)) are formed around Schottky diode 30. The extent of the isolation structures is determined by considerations outside the scope of this invention.

In accordance with the preferred embodiment of the present invention, Schottky diode 30 includes cobalt silicide ($CoSi_2$) structures 42 and 44 to provide the Schottky barrier and backside (ohmic) contact structures of the Schottky diode. The present inventors have found that the formation of $CoSi_2$ structures on an isolated P-well provides a Schottky diode exhibiting a lower threshold barrier, thus providing a lower turn-on voltage (Von) and higher forward currents despite the lower effective Richardson constant $A^{**}$ relative to a diode formed on N-type material, thus facilitating the production of highly effective RF devices. In other embodiments, silicide structures 42 and 44 may be formed using other silicide types (e.g., (e.g., titanium silicide ($TiSi_2$) or nickel silicide ($NiSi_2$)), but the present inventors currently believe $CoSi_2$ structures produce the most beneficial low voltage Schottky characteristics for the 0.18 μm process generation.

According to another aspect of the preferred embodiment, a bias voltage source (not shown) is coupled to buried N-well 17 by way of metal electrodes 33 that extend through vias (openings) in outer isolation structure 15 and contact N+ implants 13. The use of lightly-doped buried N-well 17 as an isolating ring reduces capacitance and increases the breakdown voltage of Schottky diode 30. The bias voltage applied to buried N-well 17 through metal electrodes 33 further serves to isolate P-well 20 from substrate 11, thereby further improving the noise isolation characteristics of Schottky diode 30, thus facilitating superior RF characteristics.

Referring to the left side of FIG. 1, FET 70 is a substantially conventional CMOS transistor that is also formed on substrate 11 in well region 21 using CMOS processing techniques. FET 70 generally includes a gate structure 72 positioned between a first terminal (e.g., source) 74A and a second terminal (e.g., drain) 74B. Peripheral isolation structures 15 are formed around FET 70.

In accordance with another aspect of the present invention, Schottky diode 30 is entirely or substantially fabricated using standardized diffusions and structures that are utilized in the fabrication of NMOS and PMOS field effect transistors, exemplified by FET 70. First, isolation structure 50 of Schottky diode 30 includes a polysilicon structure and associated oxide structures that are substantially identical to gate structure 72 of FET 70. In accordance with another aspect of the present invention, metallic contact 32, isolating ring terminal 33, backside contact 34, and FET terminals 74A and 74B include similar structures that are formed simultaneously with their equivalent NMOS or PMOS structures. In the exemplary case, $CoSi_2$ on P-type silicon, the backside contact structure 34 employs the same implants used in the source/drain structures of PMOS transistors. The deep N-well contacts employ the same implants used to form the source/drain structures of NMOS transistors. In a similar fashion, all metallic elements, the silicides 42, 43 and 44 in the Schottky diode and 48A and 48B in the transistors are formed in the same processing steps, just as the contact liners and plugs, 62, 63, 64, 68A and 68B. By forming the various structures of Schottky diode 70 in accordance with at least one of these aspects, the present invention provides a highly efficient method for fabricating Schottky diodes with minimal interruption to an established CMOS fabrication flow, thus minimizing the manufacturing costs associated with ICs (e.g., RF and MS CMOS ICs) that utilize Schottky diodes. These aspects will now be described in additional detail.

In accordance with the first aspect, isolation structure 50 of Schottky diode 30 is substantially identical to gate structure 72 of FET 70. Isolation structure 50 of Schottky diode 30 includes a thin lower oxide layer 55A, a doped polycrystalline silicon (herein "polysilicon") structure 56A formed on lower oxide layer 55A, oxide (sidewall spacer) structures 58A and 59A formed on opposing side walls of polysilicon structure 56A, and an optional silicide structure 46A formed on an upper surface of polysilicon structure 56A. Similarly, gate structure 72 of FET 70 includes a gate oxide layer 55B, a doped polysilicon gate structure 56B, sidewall spacer structures 58B and 59B, and a silicide structure 46B. Thin lower oxide layer 55A and gate oxide layer 55B are formed simultaneously using known techniques. Polysilicon structure 56A and gate structure 56B are then simultaneously formed on the respective oxide layers using known polysilicon processing techniques. Oxide structures 58A and 59A and sidewall spacers 58B and 59B are then simultaneously formed using known sidewall spacer fabrication techniques. Finally, silicide structures 46A and 46B are then simultaneously formed using known silicide formation techniques. By forming isolation structure 50 using the same structures and processes utilized to form gate structure 72, the fabrication of Schottky diode 30 can be carried out simultaneously with the formation of FETs during a standardized CMOS process flow.

According to the second aspect of the present invention, metallic contact 32, isolating ring terminal 33, and backside contact 34 of Schottky diode 30 are formed using the same structures and process steps as those used to form terminals 74A and 74B of FET 70. The implants comprising the backside contact are implants used for one type of transistor, for example PMOS, while the implants used to form the deep well contact are implants used to form the opposite type of transistor, for example NMOS. These principles are consistent with forming ohmic contacts respectively to regions 20 and 19 of the Schottky diode. In particular, silicide structures 42 and 44 of Schottky diode 30 are formed using the same silicide material (e.g., cobalt silicide ($CoSi_2$), titanium silicide ($TiSi_2$), or nickel silicide ($NiSi_2$)) that are used to form silicide structures 48A and 48B of terminals 74A and 74B. In addition, terminals 32, 33 and 34 of the Schottky diode 30 include metallic contact plugs 62, 63 and 64, respectively, that are formed simultaneously with metallic contact plugs 68A and 68B of terminals 74A and 74B, respectively. By forming the anode/cathode structures of Schottky diode 30 using the same structures and processes utilized to form terminals 74A and 74B of FET 70, the fabrication of Schottky diode 30 can be carried out simultaneously with the formation of FETs during a standardized CMOS process flow.

According to the third aspect, the backside contact 34 of Schottky diode 30 is formed on doped contact region 24 using the same dopant concentrations and the same processing steps as those used to form source/drain diffusion regions 28A and 28B. In particular, contact region 24 includes a heavily doped portion 23H that is formed simultaneously with heavily doped drain (HDD) regions 27H of terminals 74A and 74B, and a lightly doped portion 23L that is located under oxide structure 59A and formed simultaneously with lightly doped drain (LDD) regions 27L of terminals 74A and 74B. The doping processes and concentrations utilized to form suitable HDD regions 27H and LDD regions 27L are well established. These same processes and concentrations are utilized in the formation of contact region 24, thus facilitating the fabrication of Schottky diode 30 simultaneously with the formation of FET 70 during a standardized CMOS process flow. Note that doped contact region 23 of isolating ring terminal 33 may also be formed using the same dopant concentrations and the same processing steps as those used to form source/drain diffusion regions 28A and 28B of transistors having the opposite conductivity characteristics from those applicable to the backside contact 23.

As set forth above, each structure of Schottky diode 30 corresponds to an associated structure of CMOS FET 70, thereby allowing the fabrication of each of these structures with minimal interruption to a standardized CMOS (or BiCMOS) process flow. Thus, the use these Schottky diode structures reduces fabrication costs by eliminating additional steps associated with forming these structures. While fabrication costs of CMOS IC device 10 is minimized by incorporating all of the structures described above, the benefits of reduced fabrication costs may be achieved by using one or more of these structures in combination with conventional Schottky diode structures. The sole complexity which may be added to some processes that do not already incorporate this structure, is the deep well which isolates the Schottky body from the substrate.

Referring again to FIG. 1, the operating characteristics of Schottky diode 30 will now be described. First, the Schottky barrier of Schottky diode 30, which is formed at the junction between metallic silicide structure 42 and well portion 22, is separated from the backside contact 34 by a width W defined by isolation structure 50. Because isolation structure 50 is formed using known CMOS gate fabrication techniques, width W can be made substantially smaller (narrower) than conventional Schottky diodes that utilize, e.g., STI-based isolation structures. In addition, isolation structure 50 is formed entirely over upper surface 12, in contrast to conventional STI-based isolation structures that extend into substrate 11. Consequently, Schottky diode 30 exhibits substantially lower series resistance and parasitic capacitance, which improves the efficiency of the diode, particularly at very low operating voltage, e.g., 1 Volt. Note that the Schottky diode structure of the present invention has enhanced electric fields at the periphery of the metallic region. This tends to reduce the effective turn-on voltage, which is desirable for low voltage operations, but it tends to increase the leakage under reverse bias conditions, which is undesirable. However, the overall balance of improved low voltage characteristics and reduced series resistance are deemed by the inventors as an acceptable trade off.

Figure 2:
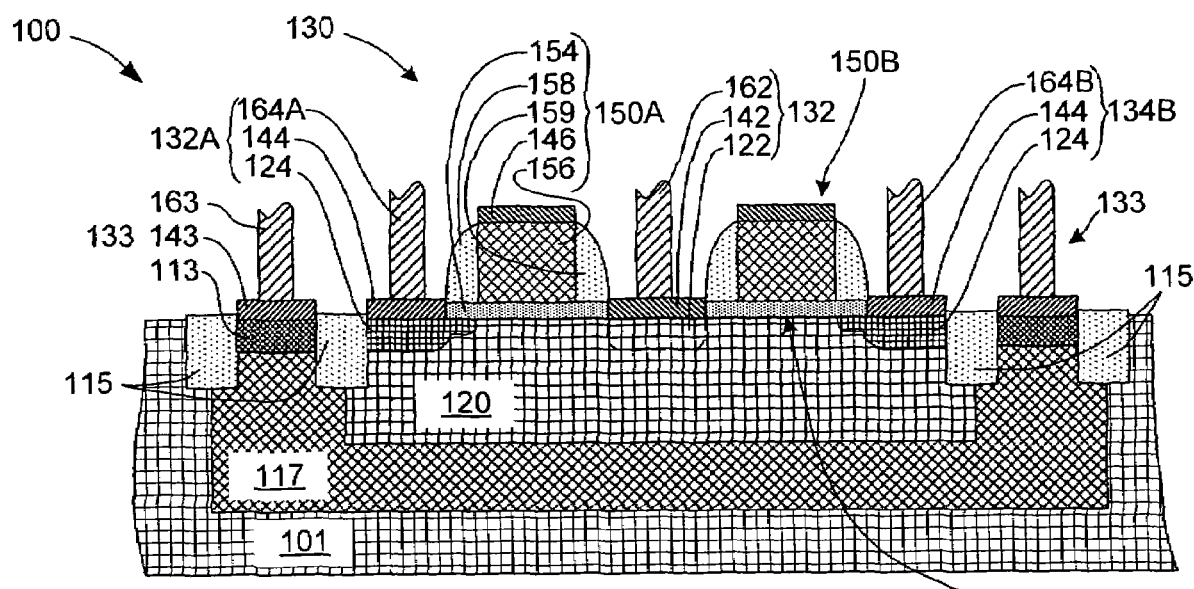
FIG. 2 is a cross-sectional side view showing a gate-defined Schottky diode according to another embodiment of the present invention.
Figure 3:
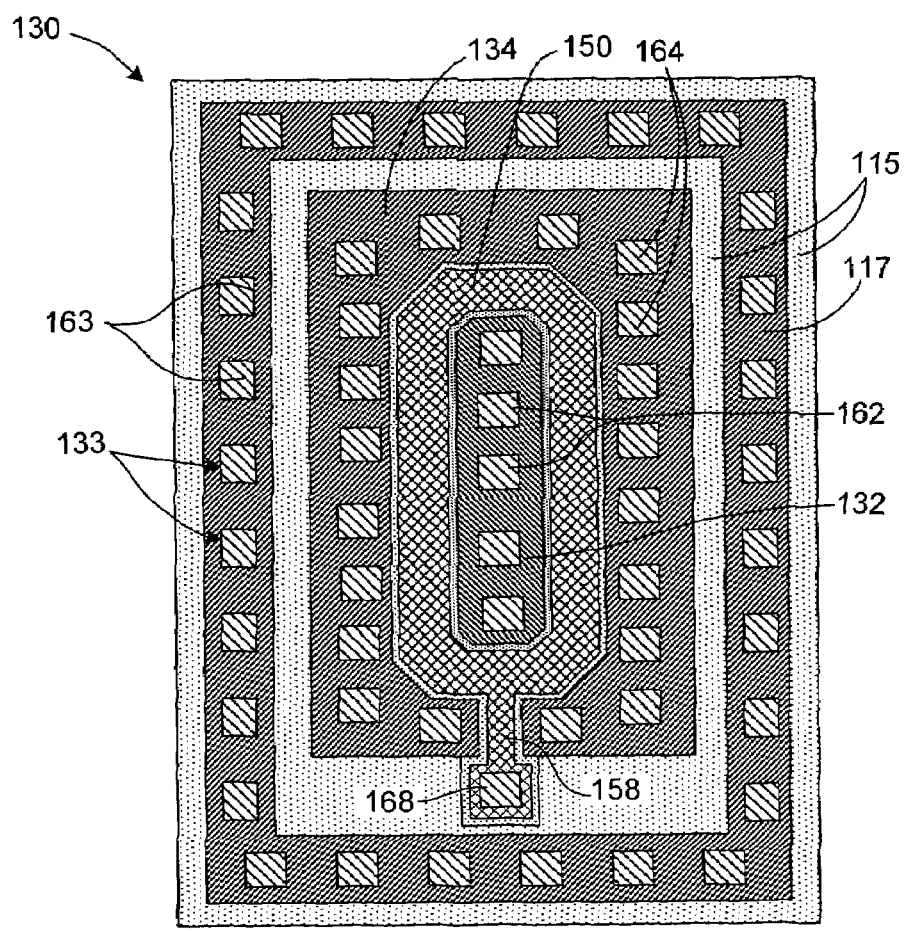
FIG. 3 is modified top view showing the Schottky diode of FIG. 2 in additional detail.

FIG. 2 is a cross-sectional side view showing a CMOS IC 100 including a Schottky diode 130 according to an exemplary embodiment of the present invention. FIG. 3 is a modified top view showing Schottky diode 130 in additional detail.

Referring to FIGS. 2 and 3, Schottky diode 130 is fabricated on an isolated P-well 120 that is substantially surrounded by a buried N-well 117, both occupying associated portions of a P-type monocrystalline silicon substrate 101. Isolated P-well 120 has a first, relatively low concentration of a P-type dopant, and is surrounded by buried N-well 117, which in turn is surrounded by substrate 101. Formed along the outside peripheral edges of isolated P-well 120 and over buried N-well 117 is at least one STI structure 115. Formed inside isolated P-well 120 is an implant 124 that is also exposed on upper surface 102, and includes a heavily doped (P+) region and a lightly doped (P−) region.

According to another aspect of the present embodiment, Schottky diode 130 includes a central Schottky barrier metallic structure 132, and an annular backside contact structure (Ohmic contact) 134 that surrounds central structure 132, with isolation structure 150 being positioned between Schottky metallic structure 132 and backside contact structure 134. Schottky diode 130 also includes isolating ring terminals 133 that connect to buried N-well 117 through STI structure 115. As indicated in FIG. 2, Schottky barrier structure 132 includes a (first) metal or metallic silicide structure 142 that is formed on a (first) portion of P-well 120, and at least one metal contact 162 extending from an upper surface of silicide structure 142. As indicated in FIG. 3, in one embodiment, Schottky barrier structure 132 is elongated, and includes several metal contacts 162. Backside contact structure 134 (which, in FIG. 2, includes side portions 134A and 134B), includes a second silicide structure 144 formed on an O-shaped, relatively highly doped (P+) region 124 of P-well 120, and multiple metal contacts 164 (e.g., metal contacts 164A and 164B) extending upward from silicide structure 144. Similarly, each isolating ring terminal 133 includes an associated silicide structure 143 formed on an associated relatively highly doped (N+) region 113 of buried N-well 117, and an associated metal contact 163 extending upward from silicide structure 143. As indicated in FIG. 3, backside contact structure 134 extends around Schottky barrier structure 132, with O-shaped isolation structure 150 positioned between an outer peripheral edge of Schottky barrier structure 132 and an inside peripheral edge of backside contact structure 134. Similarly, buried N-well 117 surrounds backside contact structure 134. As indicated in FIG. 2, isolation structure 150 (which includes side portions 150A and 150B) includes a lower thin oxide layer 154, a polysilicon structure 156 formed on oxide layer 154, oxide structure 158 and 159 formed on side walls of polysilicon structure 156, and a silicide structure 146 formed on an upper surface of polysilicon structure 156. As indicated in FIG. 3, in accordance with an embodiment, isolation structure includes an arm portion 158 that extends through a gap formed in backside contact structure 134, and a metal contact 168 formed on the silicide structure to facilitate electrical connection to the gate-type isolation structure. Metal contact 168 may be connected to a suitable bias voltage source, or it may be connected directly the backside contacts, which will assure zero bias with respect to Isolated P-well 120 and minimize parasitic capacitance.

The configuration shown in FIG. 3 assures low series resistance by providing current flow from the Schottky barrier structure 132 to backside contact 134 in two directions. Closing the gate-type isolation structure 150 to surround the Schottky barrier structure provides full isolation of that structure and serves to assure its reproducibility in manufacture. A simple stripe structure, with the cathode and anode separated by an isolating gate structure, but with the ends of the Schottky barrier defined by STI or LOCOS, would retain most of the advantages of this invention.

FIGS. 4(A) to 5(F) are simplified cross-sectional side views illustrating a process for generating Schottky diodes similar to those described above using a standard CMOS fabrication flow.

Figure 4A:
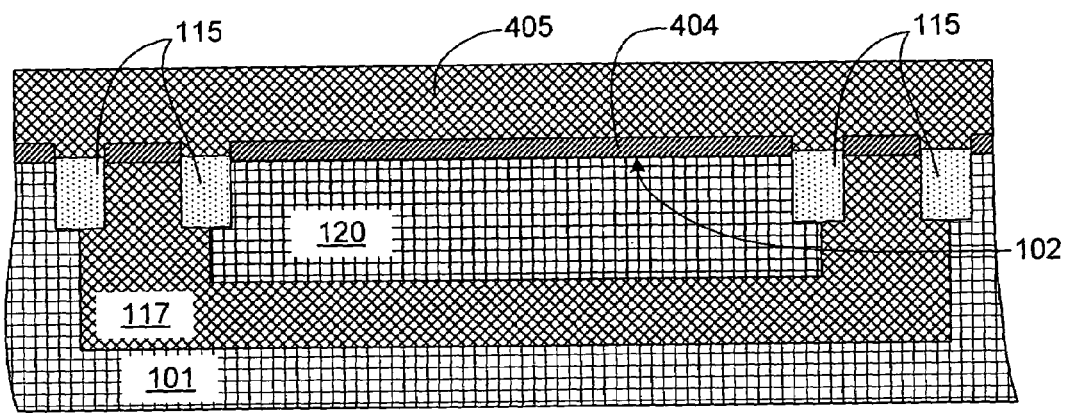
FIGS. 4(A), 4(B), 4(C), 4(D), 4(E) and 4(F) are cross-sectional side views showing a process for fabricating Schottky diodes according to another embodiment of the present invention.

Referring to FIG. 4(A), the starting material is a P-type silicon wafer 101. A thick silicon-dioxide film (about 350 nm) is formed and patterned on surface 102 of the silicon wafer using well-known STI techniques to form the isolation structures 115 between adjacent devices. A series of photo-lithography and ion implantation procedures are then performed according to known techniques to form buried N-well 117 and isolated P-well 120. Wafer 101 is then annealed by RTA (rapid-thermal-anneal) for implant activation. After the well formation, a thin layer 404 of silicon-dioxide is formed over surface 102, and a 200 nm film of polycrystalline silicon 405 is deposited over thin oxide layer 404. Layer 404 is either 3 nm or 7 nm thick, and is formed by oxidation of the exposed silicon surface 102, followed by nitridation (inclusion of nitrogen atoms in the film) and anneal steps.

Figure 4B:
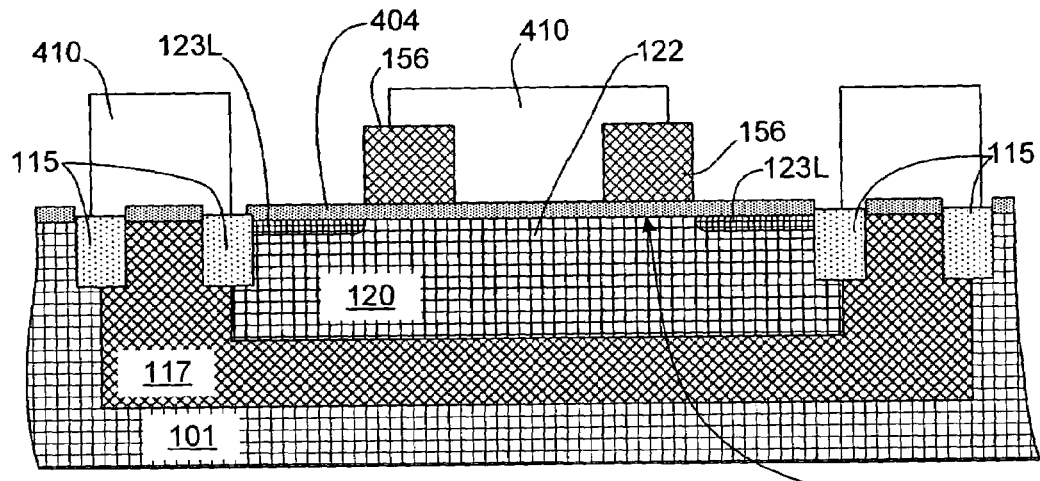

As indicated in FIG. 4(B), polycrystalline silicon 405 is patterned using known techniques to form poly-defined Schottky-diode isolation structures (spacers) 156. The polysilicon patterning step is followed by an oxidation step to form a thin oxide film (not shown) on the surface of isolation structures 156. A mask 410 is then formed over central region 122 (and N-doped regions, such as over buried N-well 117), and a lightly-doped extension implant process is performed according to known techniques to form lightly doped regions 123L. Mask 410 is subsequently removed.

Figure 4C:
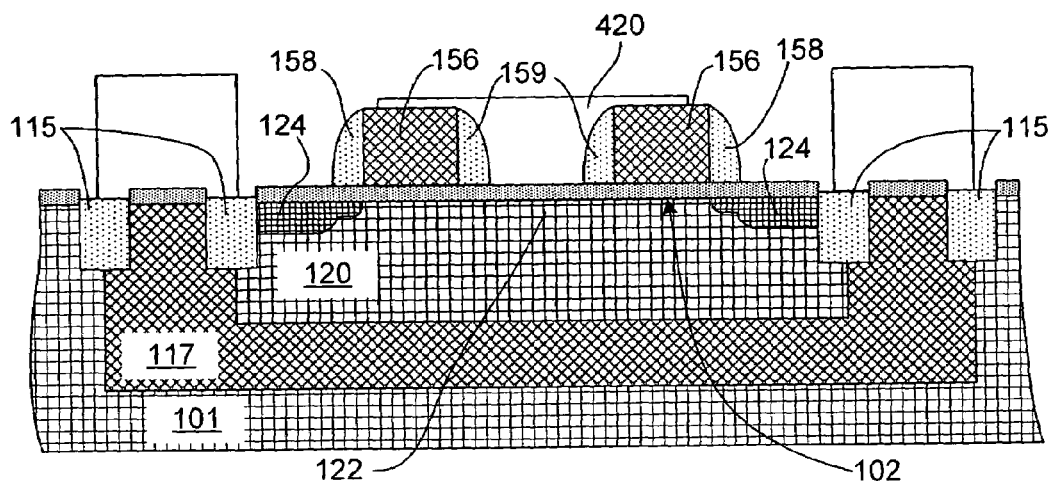

Referring to FIG. 4(C), after the extension implant step, side-wall spacers 158 and 159 are formed on the side walls of polysilicon structures 158 by deposition of oxide and nitride films, followed by an etch-back process, all according to known techniques. After spacer formation, lithography is used to form a mask 420 over central region 122, and high-dose P-type implants are formed in the exposed silicon, thereby completing the formation of Ohmic contact region 124. These implants may also be also used for doping of polysilicon structures 156. After the implant step is completed, wafer 101 is annealed by RTA for implant activation. A similar N-type implant process is used to form implants 113 (which are indicated in FIG. 4(D)) according to known CMOS techniques.

Figure 4D:
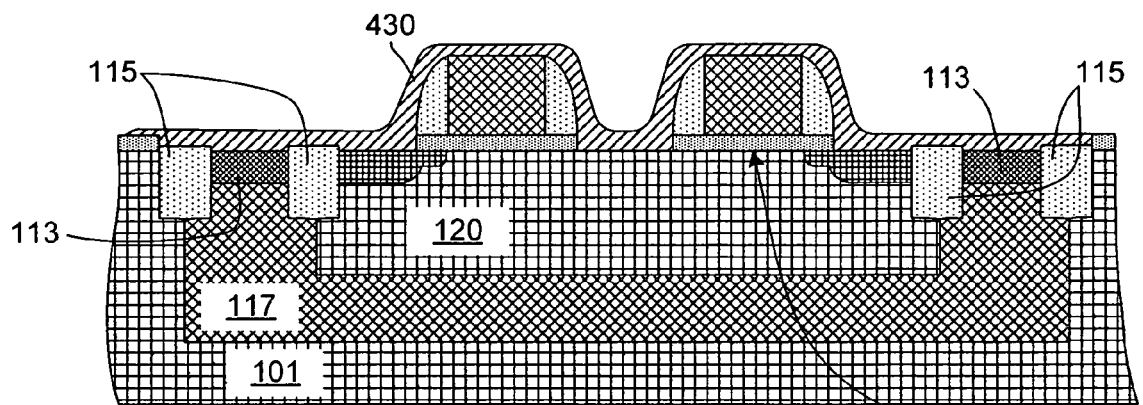

Referring to FIG. 4(D), in the next process module a self-aligned film of cobalt silicide is formed over selected regions of the Schottky-diode device. The process may include depositing and patterning a silicon oxide film over selected regions of wafer 101 to form a silicide-blocking mask (not shown). The silicide blocking mask is not important to this invention. Then wafer 101 is treated by an oxide etch process (in a dilute HF solution) to remove any thin silicon oxide film that may remain on surfaces intended for silicidation. The etch removes only a very thin layer of the oxide, so thick layers of oxide such as the STI isolation structures 115 and the silicidation blocking mask are not significantly affected. A film 430 of cobalt is then deposited on the wafer by sputtering. It is common in the art to cover the cobalt with a protective layer, and then wafer 101 is subjected to a rapid thermal treatment at about 480° C. During this thermal treatment the cobalt reacts with exposed surfaces of silicon (and polysilicon) to form cobalt silicide ($CoSi_2$). After the first thermal treatment wafer 101 is treated by wet-etch in sulfuric acid to remove any un-reacted cobalt. After this the wafer is subjected to a second rapid thermal treatment, at about 650° C., to establish the correct stoichiometry and crystal structure, which minimizes the resistivity of the cobalt silicide film.

Figure 4E:
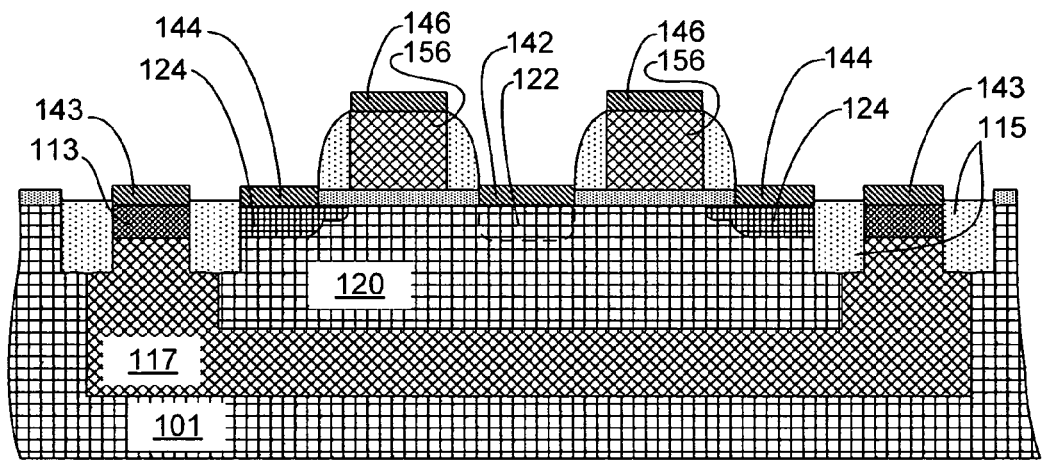

FIG. 4(E) shows the resulting $CoSi_2$ structures 142, 143, 144, 146 respectively formed over substrate regions 122, 113, and 124, and on polysilicon structures 152.

Figure 4F:
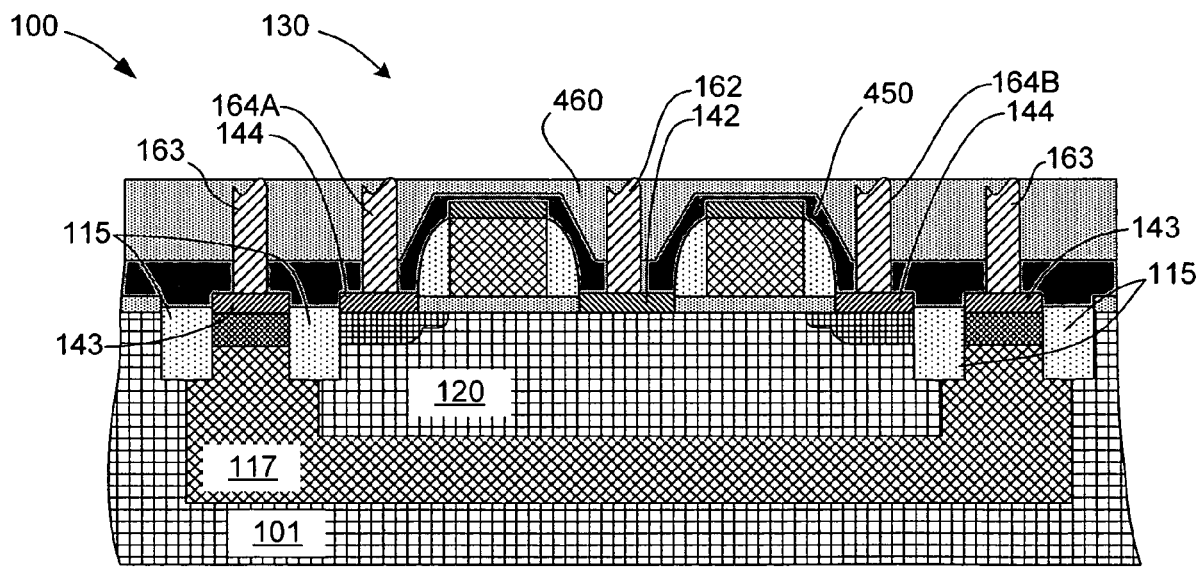

FIG. 4(F) shows the completed Schottky diodes 130. After silicide formation, a first dielectric layer is formed by deposition of a thin nitride film 550, followed by a 1000 nm thick, doped oxide (BPSG) film 460. The BPSG film is planarized by CMP, and a cap layer of oxide (not shown) is deposited to achieve total dielectric thickness of about 700 nm. Contact holes are etched through the dielectric layer, and then filled by a Titanium/titanium-nitride (Ti/TiN) liner film, followed by tungsten for completely filling the metal electrode (contacts) 162, 163 and 164 to $CoSi_2$ structures 142, 143 and 144, respectively. Excess tungsten is removed by CMP leaving tungsten inside the contact holes, forming contact plugs. A stack of Ti—TiN (total 50 nm), Aluminum-copper (500 nm) and TiN (20 nm) is deposited over the wafer surface to form the first interconnect layer (now shown) that provides contact to the various metal electrodes using known techniques. Similar methods are used to form additional metal layers over the first metal interconnect layer. After the desired number of interconnect layers are formed, thick layers of oxide and nitride are deposited on the wafer to form a protective passivation layer.

Although the present invention has been described with respect to certain specific embodiments, it will be clear to those skilled in the art that the inventive features of the present invention are applicable to other embodiments as well, all of which are intended to fall within the scope of the present invention.

Figure 5:
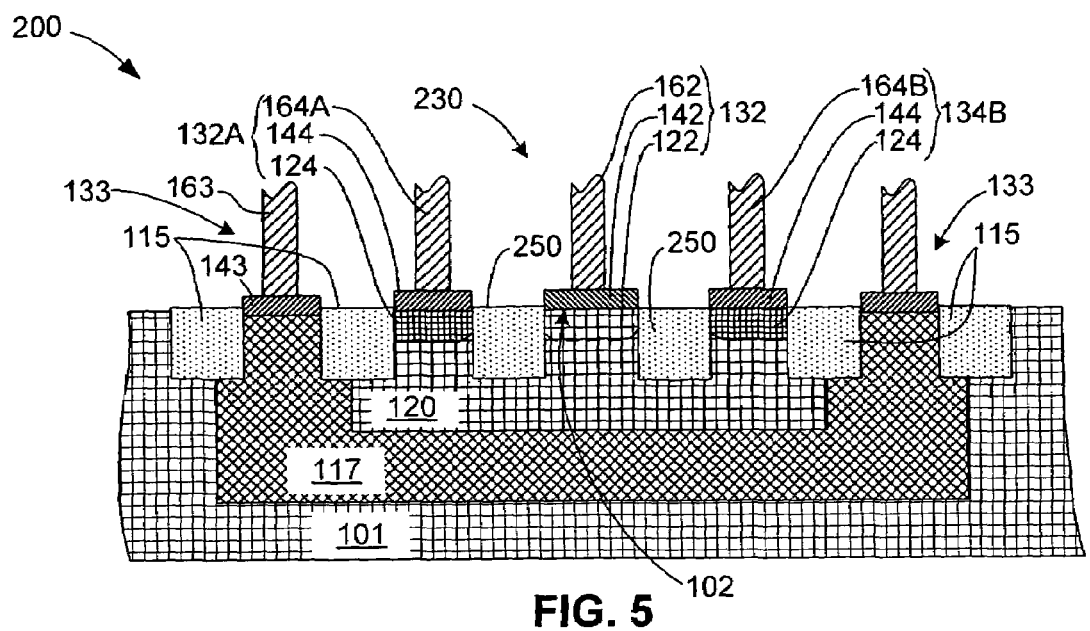
FIG. 5 is a cross-sectional side view showing a STI-defined Schottky diode according to another embodiment of the present invention.
Figure 6:
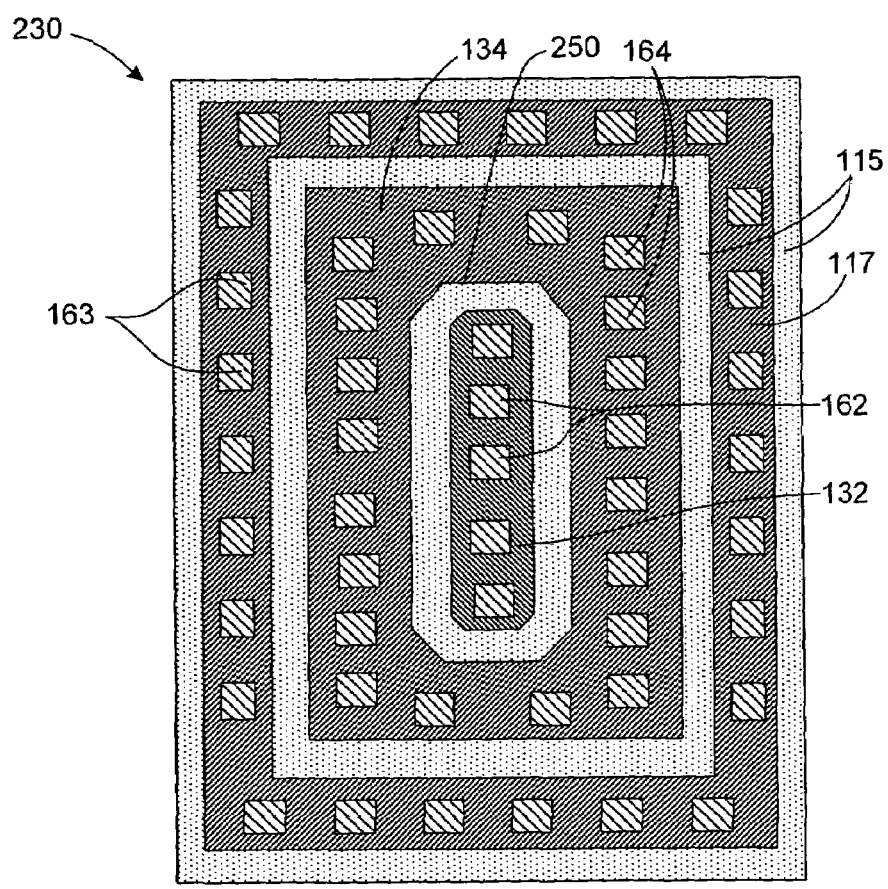
FIG. 6 is modified top view showing the Schottky diode of FIG. 5 in additional detail.

FIG. 5 is a cross-sectional side view showing a CMOS IC 200 including a Schottky diode 230 according to an alternative embodiment of the present invention. FIG. 6 is a modified top view showing Schottky diode 230 in additional detail. Structures of Schottky diode 230 that are substantially identical to those of Schottky diode 134 (described above) are identified with the same reference numbers for brevity.

Similar to Schottky diode 130, Schottky diode 230 is fabricated on isolated P-well 120 that is substantially surrounded by a buried N-well 117. STI structure 115 is formed along the outside peripheral edges of isolated P-well 120 and over buried N-well 117. Schottky diode 230 includes central Schottky barrier metallic structure 132, and annular backside contact structure 134 that are separated by an STI isolation structure 250 in a manner similar to the arrangement described above. Schottky diode 230 also includes isolating ring terminals 133 that connect to buried N-well 117 through STI structure 115. As indicated in FIG. 5, Schottky barrier structure 132 includes silicide structure 142 and metal contact 162, and backside contact structure 134 includes silicide structure 144 and metal contacts 164. Each isolating ring terminal 133 includes an associated silicide structure 143 and an associated metal contact 163. As indicated in FIG. 3, backside contact structure 134 extends around Schottky barrier structure 132, with O-shaped isolation structure 250 positioned between an outer peripheral edge of Schottky barrier structure 132 and an inside peripheral edge of backside contact structure 134. Similarly, buried N-well 117 (which is located under STI structure 115) surrounds backside contact structure 134.

As indicated in FIG. 5, STI-based isolation structure 250 differs from gate-like isolation structure 150 (described above) in that STI-based isolation structure 250 is formed entirely by an STI structure that extends into upper surface 102 over isolated well 120. Although the use of an STI isolation structure potentially increases series resistance and diode size, such a structure in combination formed on isolated P-well 120 and using $CoSi_2$ silicide structures 142 and 144 is considered superior to conventional STI-based Schottky diodes that do not include these features.

In addition, the various Schottky diodes disclosed above may be formed on an isolated N-well rather than an P-well. Materials other that $CoSi_2$, like $TiSi_2$ or $NiSi_2$, may be employed. Other variations may include the total exclusion of the LDD implant from the Schottky diode structure, or the addition of a customized implant to establish a surface carrier concentration that is not provided by implants implicit in the base CMOS process. This invention also applies when the CMOS process comprises two different well types, one for the NMOS device and one for the PMOS device, which is common in contemporary processes.

The invention claimed is:

1. A Schottky diode formed on a substrate having an upper surface, the Schottky diode comprising:
   a buried well having a first conductivity type;
   an isolated well having a second conductivity type, the isolated well being substantially surrounded by the buried well;
   a Schottky barrier structure including a first silicide structure formed on the upper surface of the substrate over a first region of the isolated well;
   a backside contact structure including a second silicide structure formed on the upper surface of the substrate over a second region of the isolated well, the second region having a high conductivity relative to the first region; and
   an isolation structure located between the first silicide structure and the second silicide structure over a third region of the isolated well,
   wherein the isolation structure comprises a polycrystalline silicon structure formed on the upper surface of the substrate.

2. The Schottky diode according to claim 1,
   wherein the isolated well comprises a P-type conductivity, and the buried well comprises an N-type conductivity, and
   wherein the first and second silicide structures comprise cobalt silicide.

3. The Schottky diode according to claim 2, further comprising a third silicide structure connected to the buried well.

4. The Schottky diode according to claim 1, wherein the isolation structure further comprises first and second oxide structures formed on opposing side walls of the polycrystalline silicon structure such that the first oxide structure is located between the polycrystalline silicon structure and the first silicide structure, and the second oxide structure is located between the polycrystalline silicon structure and the second silicide structure.

5. The Schottky diode according to claim 4, wherein the isolation structure further comprises a thin oxide layer located between the polycrystalline silicon structure and the upper surface of the substrate.

6. The Schottky diode according to claim 5, wherein the second region includes a heavily doped portion located under the second silicide structure, and a lightly doped portion communicating with the heavily doped portion and extending under the second oxide structure.

7. The Schottky diode according to claim 1, wherein the isolation structure further comprises a third silicide structure formed on the upper surface of the polycrystalline silicon structure.

8. The Schottky diode according to claim 1, wherein the backside contact structure surrounds the Schottky barrier structure.

9. The Schottky diode according to claim 8, wherein the isolation structure surrounds the Schottky barrier structure and is positioned such that the isolation structure extends between an outer peripheral edge of the Schottky barrier structure and an inner peripheral edge of the backside contact structure.

10. The Schottky diode according to claim 8, wherein the isolation structure further comprises an arm portion that extends through a gap defined in the backside contact structure.

11. A complementary metal-oxide-semiconductor integrated circuit (CMOS IC) device formed on a substrate having an upper surface, wherein the CMOS IC device comprises:
   a buried N-well formed in the substrate;
   an isolated P-well formed in the buried N-well;
   a third well separated from the buried N-well and isolated P-well;
   a Schottky diode formed on the upper surface entirely over the isolated P-well, the Schottky diode including:
      a Schottky barrier structure and a backside contact structure formed on the upper surface over first and second doped regions of the substrate, respectively, and
      an isolation structure formed on the upper surface and located between the Schottky barrier and backside contact structures over a third doped region of the substrate; and
   a field effect transistor (FET) formed on the upper surface entirely over the third well, the FET including:
   first and second terminal structures formed on the upper surface of the substrate over fourth and fifth doped regions of the substrate, respectively, and
   a gate structure formed on the upper surface of the substrate and located between the first and second terminal structures,
   wherein each of the Schottky barrier structure, the backside contact structure, and the first and second terminal structures comprise a cobalt silicide structure contacting an associated region of the upper surface.

12. The CMOS IC device of claim 11, wherein each of the isolation structure of the Schottky diode and the gate structure of the FET includes a polycrystalline silicon structure.

13. The CMOS IC device of claim 12, wherein the polycrystalline silicon structure of the isolation structure of the Schottky diode comprises a first conductivity, and the polycrystalline silicon structure of the gate structure of the FET comprises a second conductivity that is substantially identical to the first conductivity.

14. The CMOS IC device of claim 12, wherein each of the isolation structure of the Schottky diode and the gate structure of the FET further comprises:
   a thin oxide layer located between the polycrystalline silicon structure and the upper surface of the substrate; and
   first and second oxide spacer structures respectively located on opposing side walls of the polycrystalline silicon structure.

15. The CMOS IC device of claim 14, wherein each of the isolation structure of the Schottky diode and the gate structure of the FET further comprises a silicide structure formed on an upper surface of the polycrystalline silicon structure.

16. A method for fabricating a complementary metal-oxide-semiconductor integrated circuit (CMOS IC) device on a substrate having an upper surface, wherein the method comprises:
   forming a buried N-well in the substrate;
   forming an isolated P-well in the substrate such that the isolated P-well is substantially surrounded by the buried N-well;
   forming a Schottky barrier structure and a backside contact structure on the upper surface over first and second regions of the isolated P-well, respectively, and an isolation structure between the Schottky barrier and backside contact structures over a third region of the isolated P-well,
   wherein forming the Schottky barrier structure and a backside contact structure comprises forming first and second cobalt silicide structures over the first and second regions, respectively, and
   wherein forming the isolation structure between the Schottky barrier and backside contact structures comprises depositing a layer of polycrystalline silicon over the upper surface of the substrate, and etching the layer of polycrystalline silicon to form a polycrystalline silicon structure of the isolation structure.

17. The method according to claim 16, wherein forming the isolation structures further comprises forming oxide spacer structures on side walls of the polycrystalline silicon structures.

* * * * *